(12) United States Patent
Miki et al.

(10) Patent No.: US 9,543,976 B2
(45) Date of Patent: Jan. 10, 2017

(54) TIME-INTERLEAVED ANALOG-TO-DIGITAL CONVERTER

(71) Applicant: Panasonic Intellectual Property Management Co., Ltd., Osaka (JP)

(72) Inventors: Takuji Miki, Osaka (JP); Junichi Naka, Osaka (JP); Toshiaki Ozeki, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/089,404

(22) Filed: Apr. 1, 2016

(65) Prior Publication Data

US 2016/0329907 A1    Nov. 10, 2016

(30) Foreign Application Priority Data

May 7, 2015   (JP) .................................. 2015-094738

(51) Int. Cl.
| | |
|---|---|
| *H03M 1/36* | (2006.01) |
| *H03M 1/12* | (2006.01) |
| *H03M 1/08* | (2006.01) |

(52) U.S. Cl.
CPC ......... *H03M 1/1215* (2013.01); *H03M 1/0836* (2013.01)

(58) Field of Classification Search
CPC .......................... H03M 1/1215; H03M 1/0836
(Continued)

(56) References Cited

U.S. PATENT DOCUMENTS

| | | | |
|---|---|---|---|
| 4,962,380 A | 10/1990 | Meadows | |
| 7,916,050 B1 * | 3/2011 | Mujica .................. | H03M 1/004 341/118 |

(Continued)

FOREIGN PATENT DOCUMENTS

| | | |
|---|---|---|
| JP | 62-136923 | 6/1987 |
| JP | 2-060230 | 2/1990 |

(Continued)

OTHER PUBLICATIONS

Vanessa H.-C. Chen et al., "A 69.5 mW 20GS/s 6b Time-Interleaved ADC With Embedded Time-to-Digital Calibration in 32 nm CMOS SOI" IEEE J. Solid-State Circuits, vol. 49, No. 12, Dec. 2014, pp. 2891-2901.

(Continued)

*Primary Examiner* — Brian Young
(74) *Attorney, Agent, or Firm* — McDermott Will & Emery LLP

(57) ABSTRACT

A time-interleaved analog-to-digital (AD) converter includes: N AD converters; a frequency divider that receives a clock signal and applies 1/N frequency division N to the received clock signal to generate N frequency-divided clock signals to be supplied to the N AD converters; at least (N−1) variable delay circuit that adjusts delay time for at least (N−1) frequency-divided clock signal; a low pass filter circuit or an input buffer circuit that receives the clock signal and limits a frequency band of the received clock signal to generate a reference signal; and a control circuit that controls the delay time of the at least (N−1) variable delay circuit, and decreases one or more differences among digital output values output from the N AD converters when the reference signal is input to the N AD converters.

9 Claims, 4 Drawing Sheets

(58) Field of Classification Search
USPC .......................................... 341/118, 120, 159
See application file for complete search history.

(56) References Cited

U.S. PATENT DOCUMENTS

| | | | |
|---|---|---|---|
| 9,209,825 B1* | 12/2015 | Visani ................. | H03M 1/0626 |
| 9,270,291 B1* | 2/2016 | Parnaby ............... | H04L 7/0004 |
| 9,281,834 B1* | 3/2016 | Waltari ............... | H03M 1/0626 |
| 2006/0250288 A1 | 11/2006 | Fernandez et al. | |
| 2009/0278716 A1 | 11/2009 | Kawahito et al. | |

FOREIGN PATENT DOCUMENTS

| | | |
|---|---|---|
| JP | 2006-313162 | 11/2006 |
| JP | 2009-272915 | 11/2009 |

OTHER PUBLICATIONS

Zheng Liu et al., "A New Calibration Method for Sampling Clock Skew in Time-interleaved ADC" IEEE International Instrumentation and Measurement Technology Conference, May 2008.
The Extended European Search Report dated Jul. 1, 2016 for the related European Patent Application No. 16162115.6.

* cited by examiner

TIME-INTERLEAVED ANALOG-TO-DIGITAL CONVERTER

BACKGROUND

1. Technical Field

The present disclosure relates to a time-interleaved analog-to-digital (AD) converter.

2. Description of the Related Art

Time-interleaved analog-to-digital (AD) converters have various architectures and are used in ways dependent on specifications thereof, which include the resolution, sampling frequency, and power consumption. Since, among such AD converters, an AD converter that operates at high-speed sampling frequencies higher than 1 GHz is difficult to be implemented with a single AD converter, a time-interleaved AD converter is often used.

The time-interleaved AD converter has an architecture in which N AD converters referred to as "channel AD converters" hereinafter, N representing an integer equal to or larger than two, are arranged and operational clock signals with phases that are evenly shifted are respectively input to the N AD converters and after the AD conversion, output data are coupled. Thus, the operational clock frequency of each channel AD converter can be caused to be 1/N times as high as the sampling frequency. As a result, even a high-speed AD converter whose sampling frequency is higher than 1 GHz can be implemented.

In the time-interleaved AD converter, however, various errors occur, which are caused by unevenness in or mismatch among elements that make up each channel AD converter. Particularly, a timing error, which is hereinafter referred to as a "timing skew", of a clock signal caused in sampling is a major issue because such an error deteriorates the precision of the AD conversion, that is, the signal-to-noise (SN) ratio.

The timing skew is caused by unevenness in or mismatch of switches or capacitors in the sampling circuits of the channel AD converters, or a difference in paths from a clock generation circuit to the channel AD converters. The AD conversion result obtained when a timing skew is caused includes a spurious signal that occurs on an output spectrum thereof. Particularly when a high-frequency signal is input, a large AD conversion error caused by the timing skew appears and thus, the SN ratio is largely decreased.

Many methods have been proposed so as to correct a timing skew that occurs in a time-interleaved AD converter. Such methods include a method in which a reference signal is supplied to an input signal and a phase of a clock signal of each channel AD converter is adjusted using a variable delay circuit or the like. This method can correct a timing skew with reliability and in a short time. The proposed methods include a method in which a timing skew is estimated by inputting a signal generated by a digital-to-analog converter, referred to as a DAC hereinafter, as a reference signal while shifting the phase of the signal, and by detecting an edge of the signal (see, for example, V. H.-C. Chen and L. Pileggi, "A 69.5 mW 20 GS/s 6b Time-Interleaved ADC With Embedded Time-to-Digital Calibration in 32 nm CMOS SOI", IEEE J. Solid-State Circuits, vol. 49, no. 12, pp. 2891-2901, December 2014), The proposed methods also include a method in which a ramp wave is input as a reference signal and delay of a clock signal of each channel AD converter is adjusted so that the AD conversion results of the channel AD converters are the same as one another (see, for example, Z. Liu, K. Honda, and S. Kawahito, "A New Calibration Method for Sampling Clock Skew in Time-interleaved ADC", IEEE International Instrumentation and Measurement Technology Conference, May 2008).

SUMMARY

One non-limiting and exemplary embodiment provides a time-interleaved analog-to-digital (AD) converter, which can reduce timing skews.

In one general aspect, the techniques disclosed here feature a time-interleaved AD converter including: N AD converters that each convert an analog input voltage into a digital output value, N representing an integer equal to or larger than two; a frequency divider that receives a clock signal and applies N frequency division to the received clock signal to generate N frequency-divided clock signals to be supplied to the N AD converters; at least (N−1) variable delay circuit that adjusts delay time for at least (N−1) frequency-divided clock signal included in the N frequency-divided clock signals to be supplied to the N AD converters; a low pass filter circuit that receives the clock signal and limits a frequency band of the received clock signal to generate a reference signal, or an input buffer circuit that receives the clock signal and limits a frequency band of the received clock signal to generate a reference signal; and a control circuit that controls the delay time of the at least (N−1) variable delay circuit, and decreases one or more differences among digital output values output from the N AD converters when the reference signal is input to the N AD converters.

A time-interleaved AD converter according to the present disclosure can reduce timing skews.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
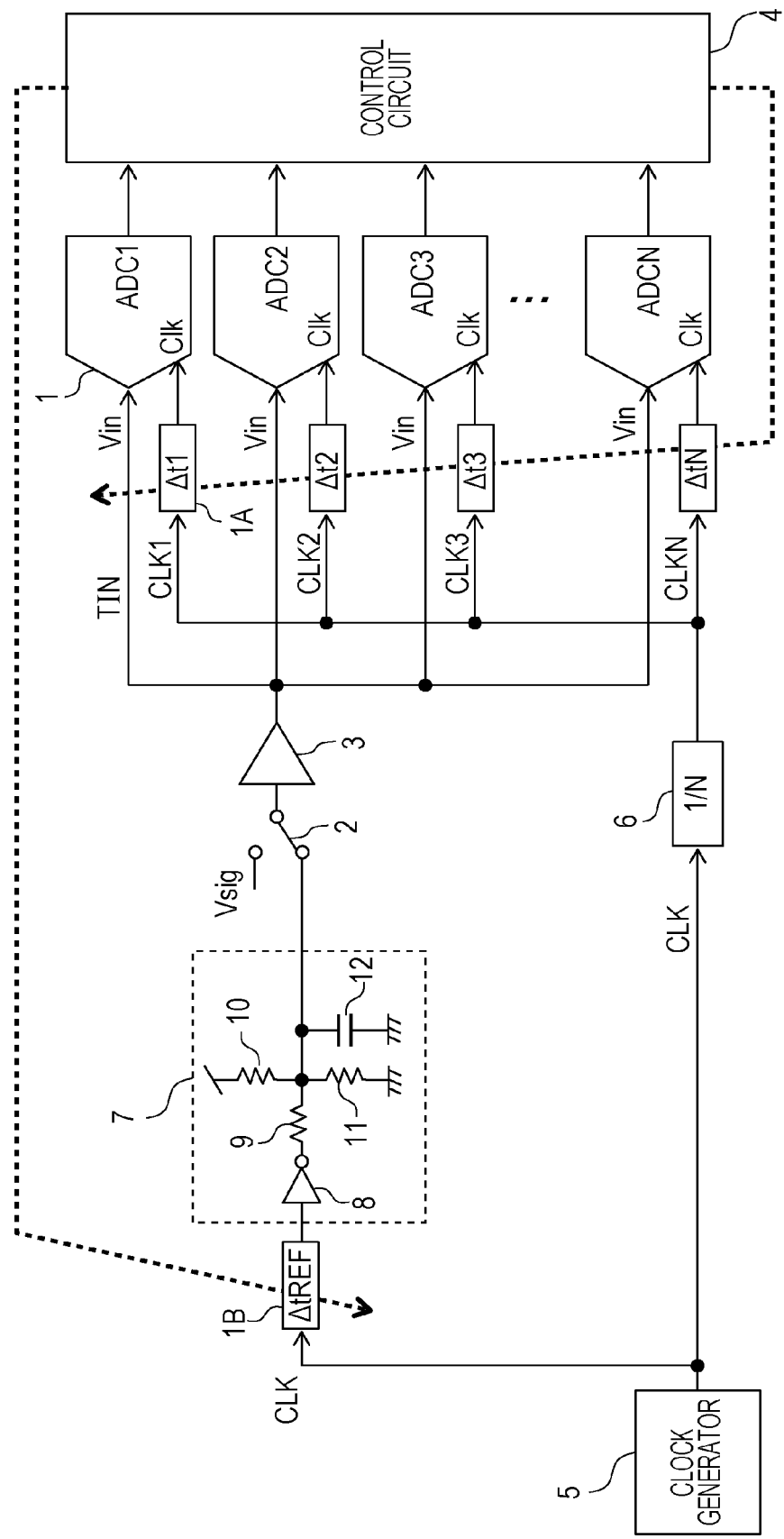
FIG. 1 is a block diagram that illustrates a configuration example of a time-interleaved analog-to-digital (AD) converter according to an embodiment of the present disclosure.

Underlying Knowledge Forming Basis of Present Disclosure

First of all, underlying knowledge forming the basis of the present disclosure is described. According to a conventional timing skew correction method, detailed phase control steps need to be taken for DAC outputs when enhancement in speed and resolution of an analog-to-digital (AD) converter is attempted. Thus, increase in correction time or complication of an additional circuit for the correction arises. Besides, it also becomes more difficult to achieve the generation of a reference signal, such as a ramp wave, as the enhancement in speed and resolution of the AD converter progresses.

Thus, the present inventors have assiduously conducted studies for attaining a time-interleaved AD converter that can correct a timing skew accurately and prevent the occurrence of an AD conversion error while the scale of an additional circuit for correction is restrained.

An aspect of the present disclosure is a time-interleaved AD converter including: N AD converters that each convert an analog input voltage into a digital output value, N representing an integer equal to or larger than two; a frequency divider that receives a clock signal and applies N frequency division to the received clock signal to generate N frequency-divided clock signals to be supplied to the N AD converters; at least (N−1) variable delay circuit that adjusts delay time for at least (N−1) frequency-divided clock signal included in the N frequency-divided clock signals to be supplied to the N AD converters; a low pass filter circuit that receives the clock signal and limits a frequency band of the received clock signal to generate a reference signal, or an input buffer circuit that receives the clock signal and limits a frequency band of the received clock signal to generate a reference signal; and a control circuit that controls the delay time of the at least (N−1) variable delay circuit, and decreases one or more differences among digital output values output from the N AD converters when the reference signal is input to the N AD converters.

According to the present aspect, the delay time of the at least (N−1) variable delay circuit is controlled to reduce one or more differences among the digital output values output from the N AD converters when the reference signal is input to the N AD converters. The reference signal is generated through the limitation of the frequency band of the clock signal. The phases of the sampling of the N AD converters can be made even accordingly. Thus, decrease in performance of the AD conversion, which is caused by a timing skew, can be restrained.

In the time-interleaved AD converter according to the above-described aspect, the low pass filter circuit may be made up of one or more passive elements when the time-interleaved AD converter comprises the low pass filter circuit.

According to the present aspect, the frequency band limitation is performed by the low pass filter circuit that uses the one or more passive elements and thus, the scale of the circuit that performs the frequency band limitation can be restrained.

The time-interleaved AD converter according to the above-described aspect may further include an adjust circuit that adjusts an amplitude and a common potential of the clock signal to be received by the input buffer circuit when the time-interleaved AD converter comprises the input buffer circuit.

According to the present aspect, the frequency band limitation is performed by the input buffer circuit and thus, the scale of the circuit that performs the frequency band limitation can be restrained.

In the time-interleaved AD converter according to the above-described aspect, the adjust circuit may include at least one resistor.

In the time-interleaved AD converter according to the above-described aspect, the adjust circuit may be a low pass filter circuit made up of one or more passive elements.

In the time-interleaved AD converter according to the above-described aspect, the control circuit may control the delay time of the at least (N−1) variable delay circuit, and cause each of the one or more differences among the digital output values to be equal to or smaller than a predetermined value.

In the time-interleaved AD converter according to the above-described aspect, the control circuit may control the delay time of the at least (N−1) variable delay circuit, and cause a difference between a digital output value output from each of (N−1) AD converter and a digital output value output from an AD converter other than the (N−1) AD converter to be equal to or smaller than a predetermined value, the (N−1) AD converter and the AD converter other than the (N−1) AD converter being included in the N AD converters.

In the time-interleaved AD converter according to the above-described aspect, N variable delay circuits that adjust delay time for the N frequency-divided clock signals may constitute the at least (N−1) variable delay circuit, and the control circuit may control the delay time of the N variable delay circuits, and when the reference signal is input to the N AD converters, cause a difference between a digital output value output from each of the N AD converters and a reference value to be equal to or smaller than a predetermined value.

The time-interleaved AD converter according to the above-described aspect may further include a reference variable delay circuit that adjusts delay time for the clock signal to be received by the low pass filter circuit or the input buffer circuit, and in the time-interleaved AD converter, the control circuit may control the delay time of the reference variable delay circuit, and cause each of the N AD converters to perform sampling at a position at which inclination of a waveform of the reference signal is equal to or larger than a predetermined magnitude.

According to the present aspect, the delay time of the reference variable delay circuit is controlled, and the N AD converters each perform the sampling at a position at which the inclination of the waveform of the reference signal is equal to or larger than the predetermined magnitude. Thus, a difference in level of the reference signal, which is caused by a timing skew, can be caused to be equal to or larger than a certain value. As a result, the correction of a timing skew can be performed as desired.

An embodiment of the present disclosure is described below with reference to the drawings.

FIG. 1 is a block diagram that illustrates a configuration example of a time-interleaved AD converter according to the present embodiment. In FIG. 1, an N-channel time-interleaved AD converter in which N channel AD converters ADC1 to ADCN, N representing an integer equal to or larger than two, are arranged in parallel as AD converters 1 is taken as an example.

The time-interleaved AD converter in FIG. 1 further includes a control circuit 4, a clock generator 5, and a frequency divider 6. The time-interleaved AD converter according to the present embodiment may further include a switch 2 and an input buffer 3. In addition, the time-interleaved AD converter in FIG. 1 includes N variable delay circuits Δt1, Δt2, Δt3, . . . to ΔtN. The variable delay circuits Δt1, Δt2, Δt3, . . . to ΔtN each have a configuration the same as the configuration of, for example, a variable delay circuit 1A, which is described below.

An input terminal of the input buffer 3 is connected to the switch 2 and an output terminal of the input buffer 3 is connected to each of input terminals Vin of the channel AD converters ADC1 to ADCN. The switch 2 switches the connection destination of the input terminal of the input buffer 3 between the side of an input signal Vsig and the side of a reference signal generation circuit 7, which is described below. The switch 2 may be switched manually by a user or switched automatically by the control circuit 4.

The control circuit 4 includes a multiplexer for example, and converts output data of each of the channel AD converters ADC1 to ADCN into serial data. The functions of the control circuit 4 are described further below. The clock generator 5 includes a phase-locked loop (PLL) for example, and generates a clock signal CLK of a sampling frequency Fs.

The frequency divider 6 receives the clock signal CLK generated by the clock generator 5 and applies 1/N frequency division to the received clock signal CLK to generate N frequency-divided clock signals CLK1, CLK2, CLK3, . . . to CLKN. Each of the N frequency-divided clock signals CLK1, CLK2, CLK3, . . . to CLKN has a frequency of Fs/N. The N frequency-divided clock signals CLK1, CLK2, CLK3, . . . to CLKN have phases of $2\pi/N*k$ (k=1, 2, . . . to N) from the clock signal CLK, respectively. That is, the frequency divider 6 divides the frequency of the clock signal CLK by N and generates N clock signals different in phase.

During normal operation, the switch 2 is set on the side of the input signal Vsig. The input signal Vsig passes through the input buffer 3 to be supplied to the respective input terminals Vin of the channel AD converters ADC1 to ADCN. The output data of the channel AD converters ADC1 to ADCN, which have undergone the AD conversion, are input to the control circuit 4 to be converted into serial data by the multiplexer of the control circuit 4 and are output from the control circuit 4.

An operational clock signal of the time-interleaved AD converter according to the present embodiment is now described. First, the clock signal CLK with the sampling frequency Fs, which the clock generator 5 generates, is input to the frequency divider 6. In the frequency divider 6, the frequency of the clock signal CLK is divided so that each resultant frequency is 1/N and further, the N frequency-divided clock signals CLK1 to CLKN with the phases of $2\pi/N*k$ (k=1 to N) are generated. The frequency-divided clock signals CLK1 to CLKN pass through the variable delay circuits $\Delta t1$ to $\Delta tN$, respectively, and are input to respective clock terminals Clk of the channel AD converters ADC1 to ADCN.

The N frequency-divided clock signals with the phases shifted evenly by $2\pi/N$ need to be input to the respective channel AD converters ADC1 to ADCN. In actuality, however, various error factors hinder ensuring accurate phases. One of such error factors is unevenness or mismatch between switches and capacitors in sampling circuits of the channel AD converters ADC1 to ADCN. The other factors include an error caused by a difference in length of a wiring path or parasitic capacitance among the clock signals or input signals supplied to the N channel AD converters ADC1 to ADCN. A phase error caused in the clock signals of the channel AD converters ADC1 to ADCN for the above-described reasons is referred to as a timing skew and appears as an error of the AD conversion result.

The time-interleaved AD converter according to the present embodiment may further include the reference signal generation circuit 7 and a reference variable delay circuit $\Delta tREF$ as a variable delay circuit 1B for a reference signal.

The reference signal generation circuit 7 receives the clock signal CLK on which the frequency division into 1/N has not been performed. The reference signal generation circuit 7 includes an inverter circuit 8, resistors 9 to 11, and a capacitor 12. The resistors 9 to 11, which are examples of the passive element, and the capacitor 12, which is an example of the passive element, make up a frequency band limitation circuit, which is an example of the low pass filter circuit.

The reference variable delay circuit $\Delta tREF$ is provided between the clock generator 5 and the reference signal generation circuit 7. The functions of the reference variable delay circuit $\Delta tREF$ are described below.

Figure 2:
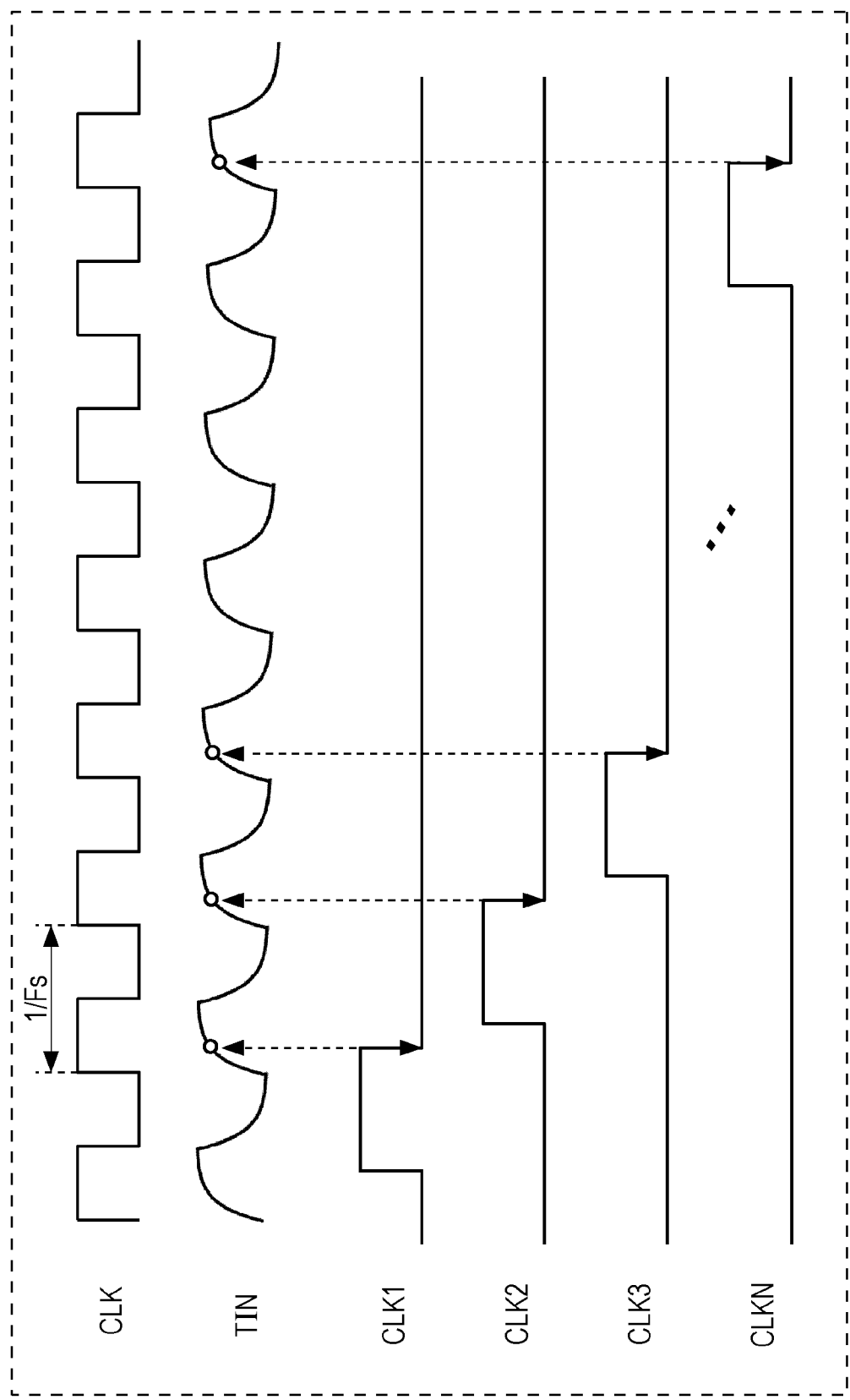
FIG. 2 is a clock timing diagram in a case where timing skew correction is performed in the time-interleaved AD converter in FIG. 1.

FIG. 2 is a clock timing diagram in a case where the timing skew correction is performed in the time-interleaved AD converter in FIG. 1. A method of correcting a timing skew is described below using the configuration diagram in FIG. 1 and the clock timing diagram in FIG. 2.

The switch 2 is switched to the side of the reference signal generation circuit 7 first, and an output signal from the reference signal generation circuit 7 is supplied to the input buffer 3. The clock signal output from the inverter circuit 8 undergoes low pass filtering through the frequency band limitation circuit that includes the resistors 9 to 11 and the capacitor 12. The time constants of rises and falls of the clock signal that has passed through the reference signal generation circuit 7 deteriorates accordingly. As a result, a rounded waveform like a signal TIN illustrated in the timing diagram in FIG. 2 is generated.

The resistors 9 to 11 also function as a circuit that adjusts the amplitude and common voltage value of the clock signal CLK input. In the case illustrated in FIG. 1, the resistors 9 to 11 adjust the amplitude and common voltage value of the clock signal CLK in accordance with the input range of the input buffer 3.

When the time-interleaved AD converter uses a circuit like the input buffer 3 to drive an input signal, the capacitor 12 described above is not necessarily desired. A typical input buffer is designed so as to ensure gain within the frequency band of the input signal. Thus, in many cases, the input buffer is already out of the frequency band with respect to the frequency of the clock signal of the sampling that is higher in speed than the input signal. That is, the input buffer 3, which is an example of the input buffer circuit, functions as the frequency band limitation circuit.

After the frequency band limitation by the above-described method, the signal TIN with the deteriorated time constants of rises and falls is input to each of the channel AD converters ADC1 to ADCN. The clock signal CLK is generated by the clock generator 5, which includes the PLL or the like, as a pulse signal with an accurate phase. Thus, the signal TIN functions as the reference signal TIN with an accurate sampling phase. That is, the channel AD converters ADC1 to ADCN can each correct a timing skew by adjusting a phase at each timing of the sampling on the basis of the reference signal TIN.

As illustrated in the timing diagram in FIG. 2, the channel AD converters ADC1, ADC2, . . . to ADCN sequentially perform the sampling on the reference signal TIN in accordance with the frequency-divided clock signals CLK1, CLK2, . . . to CLKN, respectively, at phase intervals that each correspond to a cycle of the clock signal CLK before the frequency division.

In an ideal state where no timing skew occurs, the channel AD converters ADC1 to ADCN are each supposed to perform the sampling on the same input voltage value of the reference signal TIN. Accordingly, all of the channel AD converters ADC1, ADC2, . . . to ADCN output the same digital values as AD conversion output values.

When, in contrast, any of the digital values output from the channel AD converters ADC1 to ADCN differs, the difference implies that a timing skew has occurred. In this case, the control circuit 4 adjusts the variable delay circuits Δt1, Δt2, . . . to ΔtN so that the same digital values are output from all of the channel AD converters ADC1, ADC2, . . . to ADCN. In this manner, the control circuit 4 reads a timing skew in a digital value and controls the variable delay circuits Δt1 to ΔtN. Thus, the timing skew can be corrected. For example, the control circuit 4 detects one or more differences among the digital outputs of the channel AD converters ADC1 to ADCN and in accordance with the detected one or more differences, adjusts the delay time of one or more variable delay circuits corresponding to the one or more differences.

Figure 3:
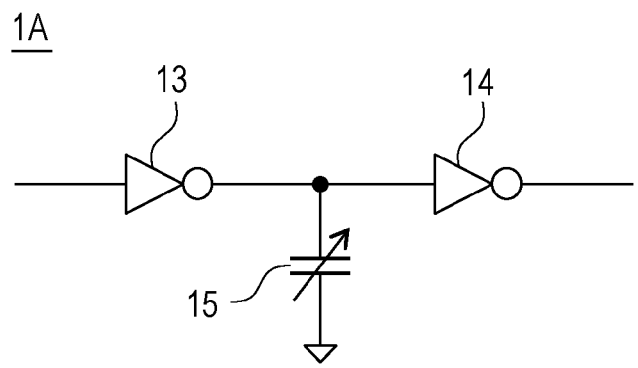
FIG. 3 is a circuit diagram that illustrates a configuration example of a variable delay circuit.

FIG. 3 is a circuit diagram that illustrates a configuration example of the variable delay circuit 1A. The variable delay circuits Δt1 to ΔtN each have a configuration the same as the configuration of the variable delay circuit 1A in FIG. 3. That is, each of the variable delay circuits Δt1 to ΔtN includes a series circuit of inverters 13 and 14 to which corresponding one of the frequency-divided clock signals CLK1 to CLKN is propagated, and a variable capacitor 15 connected to a midway node in the series circuit. The capacitance value of the variable capacitor 15 varies, depending on a digital signal input from the control circuit 4.

When the capacitance value of the variable capacitor 15 is large, the settling of the frequency-divided clock signals CLK1 to CLKN deteriorates and time taken for the signal levels of the frequency-divided clock signals CLK1 to CLKN to exceed a threshold value of the inverter 14 at the subsequent stage increases. Thus, the delay time of the frequency-divided clock signals CLK1 to CLKN can be increased.

When the capacitance value of the variable capacitor 15 is small, the signal levels of the frequency-divided clock signals CLK1 to CLKN can exceed the threshold value of the inverter 14 at the subsequent stage in a short time. Thus, the delay time of the frequency-divided clock signals CLK1 to CLKN can be restrained. By setting the capacitance value of the variable capacitor 15 to a median value of the variable range as an initial value, the frequency-divided clock signals CLK1 to CLKN can be increased in speed, that is, the delay time of the frequency-divided clock signals CLK1 to CLKN can be decreased, or the frequency-divided clock signals CLK1 to CLKN can be decreased in speed, that is, the delay time of the frequency-divided clock signals CLK1 to CLKN can be increased.

That is, to increase the delay time of the variable delay circuit 1A, the control circuit 4 increases the capacitance value of the variable capacitor 15, and to decrease the delay time of the variable delay circuit 1A, the control circuit 4 decreases the capacitance value of the variable capacitor 15.

A timing skew can be detected accurately and the timing skew can be corrected in a short time by each of the channel AD converters ADC1 to ADCN performing the sampling at a position where the voltage value of the reference signal TIN changes largely.

Figure 4:
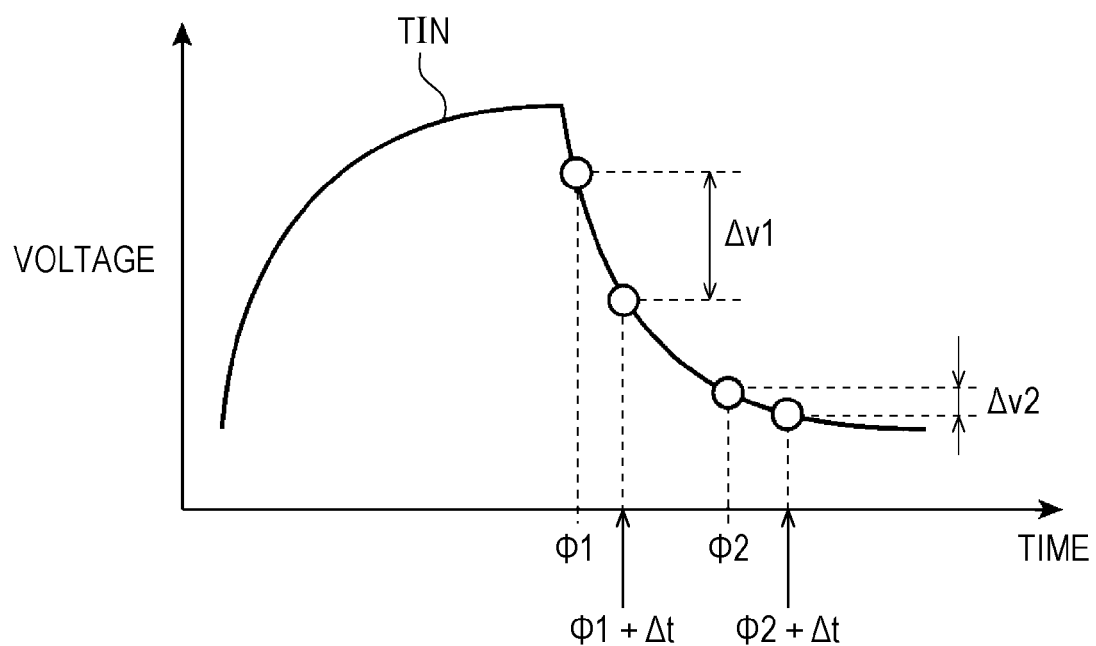
FIG. 4 schematically illustrates a waveform of a reference signal.

FIG. 4 schematically illustrates a waveform of the reference signal TIN. In FIG. 4, the horizontal axis indicates time and the vertical axis indicates voltage. FIG. 4 depicts variations in how a voltage difference caused by a timing skew occurs, depending on a sampling position.

At time φ1, which is immediately after the clock signal CLK has started settling from the H level to the L level, the inclination of the waveform of the reference signal TIN is large. Thus, a voltage difference Δv1 caused by a timing skew Δt occurs as a large difference. At time φ2 at which the voltage value enters a saturation state after the reference signal has started the settling from the H level to the L level, a voltage difference Δv2 caused by the timing skew Δt is small.

Depending on a case where, for example, the frequency of the reference signal TIN is not high, a state in which no change in voltage value of the reference signal is caused, that is, a waveform where H-level periods and L-level periods stably occur is not uncommon. Thus, if the channel AD converters ADC1 to ADCN perform sampling in such a period, no voltage difference is caused by a timing skew.

So, as illustrated in FIG. 1, the reference variable delay circuit ΔtREF for the reference signal TIN may be provided between the clock generator 5 and the reference signal generation circuit 7. The reference variable delay circuit ΔtREF may have a configuration the same as the configurations of the variable delay circuits Δt1, Δt2, . . . to ΔtN arranged between the channel AD converters ADC1, ADC2, . . . to ADCN and the frequency divider 6. Similar to the variable delay circuits Δt1 to ΔtN, the reference variable delay circuit ΔtREF adjusts the delay time of the reference signal TIN by the capacitance value of a variable capacitor being controlled in accordance with a digital value input from the control circuit 4.

In performing a correction process, the control circuit 4 controls the delay time of the reference variable delay circuit ΔtREF and causes each of the channel AD converters ADC1 to ADCN to perform the sampling at a position where the inclination of the waveform of the reference signal TIN is larger than a predetermined magnitude.

The predetermined magnitude may be for example, a voltage difference Δv0, which is predetermined with respect to a predetermined time difference Δt0.

For example, the control circuit 4 shifts the delay time of the reference variable delay circuit ΔtREF by the predetermined time difference Δt0, and in every shifting, measures the voltage value of the reference signal TIN output from the channel AD converter ADC1 for example, and calculates a voltage difference Δv of each time difference Δt0. The control circuit 4 may employ the delay time at the time when the calculated voltage difference Δv becomes equal to or larger than the predetermined voltage difference Δv0 as the delay time of the reference variable delay circuit ΔtREF, which is used for the correction process.

As another option, the control circuit 4 may employ the delay time caused when the calculated voltage difference Δv becomes the maximum value as the delay time of the reference variable delay circuit ΔtREF, which is used for the correction process.

The control circuit 4 fixes the delay time of the reference variable delay circuit ΔtREF to a value employed as the delay time used for the correction process. After that, for example, the control circuit 4 controls the capacitance value of the variable capacitor 15 in each of the variable delay circuits Δt2 to ΔtN and adjusts each delay time so that a difference between the AD conversion result of each of the channel AD converters ADC2 to ADCN and the AD conversion result of the channel AD converter ADC1 is equal to or smaller than a predetermined value. Accordingly, the timing skew can be corrected accurately. In this case, the variable delay circuit Δt1 may be omitted. The above-mentioned predetermined value can be set to a proper value based on necessary precision.

As another option, the control circuit 4 may control the capacitance value of the variable capacitor 15 in each of the variable delay circuits Δt2 to ΔtN and adjust each delay time so that a difference between the AD conversion result of each of the channel AD converters ADC2 to ADCN and the AD conversion result of the channel AD converter ADC1 is minimized. That is, for example, the control circuit 4 may shift the capacitance value of the variable capacitor 15 in the variable delay circuit Δt2 by a predetermined capacitance width ΔC0 and in every shifting, measure the respective voltage values of the reference signals TIN output from the channel AD converters ADC1 and ADC2 and calculate a voltage difference ΔV12 therebetween. Further, the capacitance value of the variable capacitor 15 at the time when the voltage difference ΔV12 is minimized may be employed as the adjusted capacitance value. The control circuit 4 may also perform the similar process on each of the variable delay circuits Δt3 to ΔtN and determine the capacitance value of the variable capacitor 15, which minimizes the error between the channel AD converter ADC1 and the variable delay circuit concerned.

Although in the description above, the process is based on the channel AD converter ADC1, the process may be based on any one of the channel AD converters ADC2 to ADCN instead. That is, the control circuit 4 may control the capacitance value of the variable capacitor 15 in each variable delay circuit and adjust each delay time so that a difference between the AD conversion result of the channel AD converter on which the process is based and the AD conversion result of one of the other channel AD converters is equal to or smaller than a predetermined value or minimized. In this case, the variable delay circuit that corresponds to the channel AD converter on which the process is based may be omitted. Specifically, the control circuit 4 compares the AD conversion result of the channel AD converter on which the process is based with the AD conversion result of one of the other channel AD converters and generates difference information. In accordance with the difference information, the control circuit 4 adjusts the delay time of the variable delay circuit corresponding to the channel AD converter concerned. The control circuit 4 performs the same process on the rest of the other channel AD converters. Thus, errors among the digital output values output from the channel AD converters ADC1 to ADCN can be reduced.

Further, although the process is based on any one of the channel AD converters ADC1 to ADCN in the description above, the control circuit 4 may calculate an average value or median value of the AD conversion results of the reference signals TIN instead, which are brought by the channel AD converters ADC1 to ADCN. The control circuit 4 may control the capacitance value of the variable capacitor 15 in each of the variable delay circuits Δt1 to ΔtN and adjust each delay time so that a difference between this calculation result and the AD conversion result of each of the channel AD converters ADC1 to ADCN is equal to or smaller than a predetermined value or minimized. That is, the calculation result is used as a reference value. The AD conversion of the reference signals TIN by the channel AD converters ADC1 to ADCN, and the calculation of the average value or median value and the adjustment of the delay time by the control circuit 4 may be repeated for a plurality of times.

Moreover, instead of the above, the control circuit 4 may store a predetermined reference value and use the stored reference value. That is, the control circuit 4 may control the capacitance value of the variable capacitor 15 in each of the variable delay circuits Δt1 to ΔtN and adjust each delay time so that a difference between the reference value stored in the control circuit 4 and the AD conversion result of each of the channel AD converters ADC1 to ADCN is equal to or smaller than a predetermined value or minimized. Thus, errors among the digital output values output from the channel AD converters ADC1 to ADCN can be reduced.

The configuration in FIG. 1 is an example of the configuration of the time-interleaved AD converter and the present disclosure is not limited to the configuration in FIG. 1. A configuration where the input signal Vsig is directly supplied to each of the channels AD converters ADC1 to ADCN without using the input buffer 3 may also be employed. That is, the present disclosure is also applicable to a time-interleaved AD converter that includes no input buffer. In this case, the capacitor 12 and the resistors 9 to 11, which make up the above-described frequency band limitation circuit, limit the frequency band of the clock signal CLK.

When the input buffer 3 is not used in the configuration, an AD converter having an architecture where rail-to-rail operation is performed on the input side may be employed as the AD converter. In this case, it is not necessarily desired for the resistors 9 to 11 to adjust the amplitude and common voltage value of the clock signal CLK.

Figure 5A:
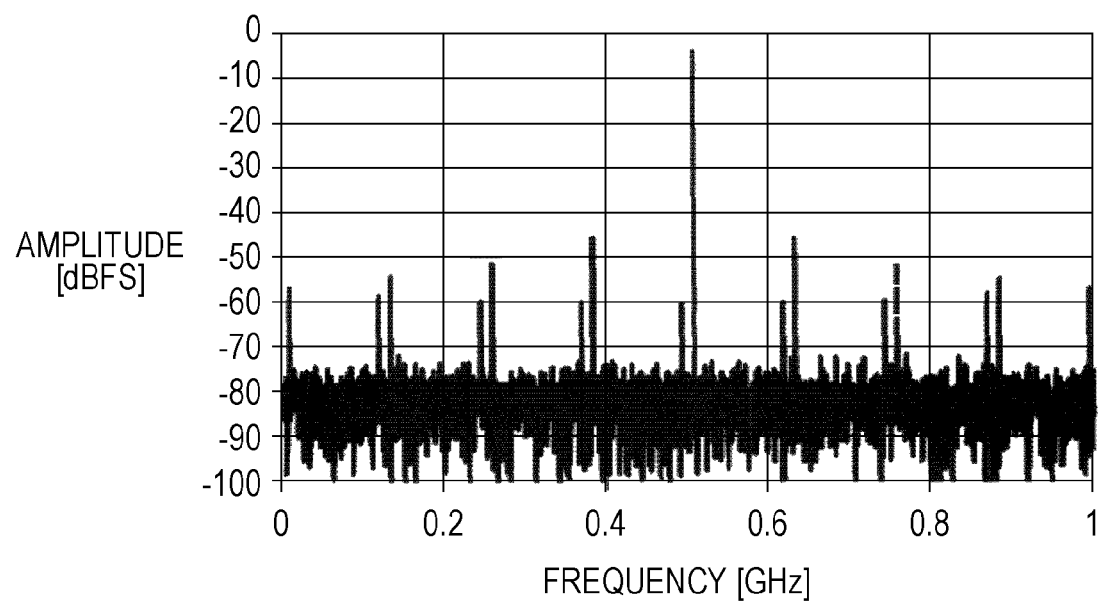
FIG. 5A illustrates a simulation result obtained when no correction is performed at the time of occurrence of a timing skew.
Figure 5B:
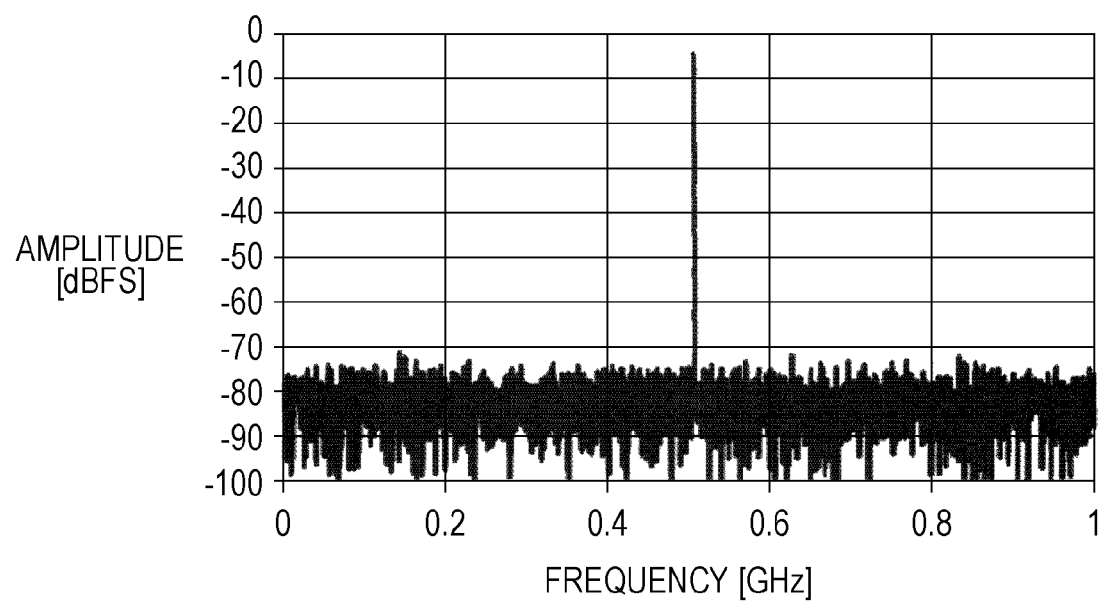
FIG. 5B illustrates a simulation result obtained when a correction method according to the embodiment is applied at the time of occurrence of a timing skew.

FIG. 5A illustrates a simulation result obtained when no correction is performed at the time of occurrence of a timing skew. FIG. 5B illustrates a simulation result obtained when the correction method according to the present embodiment is applied at the time of occurrence of a timing skew. In FIGS. 5A and 5B, the horizontal axis indicates the frequency in GHz and the vertical axis indicates the amplitude in dBFS. In the simulations of FIGS. 5A and 5B, N as the number of interleaves, that is, the number of the channel AD converters is set to 16 and the sampling frequency Fs of the clock signal CLK is set to 2 GHz.

When no correction is performed, as illustrated in FIG. 5A, a plurality of spurious components other than signal components are caused. However, it can be seen in FIG. 5B that the above-described spurious components are restrained through the application of the correction according to the present embodiment.

As described above, according to the present embodiment, a timing skew in the time-interleaved AD converter can be corrected and as a result, occurrence of an AD conversion error caused by the timing skew can be prevented. In addition, since the additional circuit used in the present embodiment, such as the frequency band limitation circuit, has a simple configuration that employs a resistor and a capacitor, the time-interleaved AD converter according to the present embodiment can be implemented as a small-scale additional circuit.

In the present disclosure, all or part of the blocks (e.g. the clock generator 5 and control circuit 4) in the block diagram illustrated in FIG. 1 may be implemented using one or more electronic circuits, which include a semiconductor device, a semiconductor integrated circuit (IC), and large-scale integration (LSI). The LSI or IC may be integrated on a single chip or made up by combining a plurality of chips. For example, the blocks other than the storage element may be integrated on a single chip. Although herein referred to as the LSI or IC, the LSI or IC may be what is referred to as system LSI, very large scale integration (VLSI), or ultra large scale integration (ULSI) because the designation depends on the degree of the integration. A field-programmable gate array (FPGA), which is programmed after manufacturing the LSI, or a reconfigurable logic device, which can reconfigure the connection relation inside the LSI or the set-up of circuit cells inside the LSI, may also be used for the same purpose.

Further, all or part of the functions or operations of the blocks in the block diagram illustrated in FIG. 1 may be implemented through software processing. In this case, the software is recorded in one or more non-transitory recording media, such as read-only memory (ROM), an optical disk, or a hard disk drive, and when the software is executed by a processor, the software causes the processor and a peripheral device to execute a specific function included in the software. A system or device may include one or more non-transitory recording media in which the software is recorded, the processor, and a hardware device needed, such as an interface.

The time-interleaved AD converter according to the present disclosure is useful for a radio communication device or radar equipment because of its capabilities of correcting a timing skew with a small-area additional circuit and preventing occurrence of an AD conversion error caused by the timing skew.

What is claimed is:

1. A time-interleaved analog-to-digital (AD) converter comprising:
   N AD converters that each convert an analog input voltage into a digital output value, N representing an integer equal to or larger than two;
   a frequency divider that receives a clock signal and applies 1/N frequency division to the received clock signal to generate N frequency-divided clock signals;
   at least (N−1) variable delay circuit that adjusts delay time for at least (N−1) frequency-divided clock signal included in the N frequency-divided clock signals to be supplied to the N AD converters;
   a low pass filter circuit that receives the clock signal and limits a frequency band of the received clock signal to generate a reference signal, or an input buffer circuit that receives the clock signal and limits a frequency band of the received clock signal to generate a reference signal; and
   a control circuit that controls the delay time of the at least (N−1) variable delay circuit, and decreases one or more differences among digital output values output from the N AD converters when the reference signal is input to the N AD converters.

2. A time-interleaved analog-to-digital (AD) converter comprising:
   N AD converters that each convert an analog input voltage into a digital output value, N representing an integer equal to or larger than two;
   a frequency divider that receives a clock signal and applies 1/N frequency division to the received clock signal to generate N frequency-divided clock signals;
   at least (N−1) variable delay circuit that adjusts delay time for at least (N−1) frequency-divided clock signal included in the N frequency-divided clock signals to be supplied to the N AD converters;
   a low pass filter circuit that is composed of one or more passive elements, receives the clock signal, and limits a frequency band of the received clock signal to generate a reference signal; and
   a control circuit that controls the delay time of the at least (N−1) variable delay circuit, and decreases one or more differences among digital output values output from the N AD converters when the reference signal is input to the N AD converters.

3. A time-interleaved analog-to-digital (AD) converter comprising:
   N AD converters that each convert an analog input voltage into a digital output value, N representing an integer equal to or larger than two;
   a frequency divider that receives a clock signal and applies 1/N frequency division to the received clock signal to generate N frequency-divided clock signals;
   at least (N−1) variable delay circuit that adjusts delay time for at least (N−1) frequency-divided clock signal included in the N frequency-divided clock signals to be supplied to the N AD converters;
   an input buffer circuit that receives the clock signal, and limits a frequency band of the received clock signal to generate a reference signal;
   an adjust circuit that adjusts an amplitude and a common potential of the clock signal to be received by the input buffer circuit; and
   a control circuit that controls the delay time of the at least (N−1) variable delay circuit, and decreases one or more differences among digital output values output from the N AD converters when the reference signal is input to the N AD converters.

4. The time-interleaved AD converter according to claim 3, wherein
   the adjust circuit includes at least one resistor.

5. The time-interleaved AD converter according to claim 3, wherein
   the adjust circuit is a low pass filter circuit composed of one or more passive elements.

6. The time-interleaved AD converter according to claim 1, wherein
   the control circuit controls the delay time of the at least (N−1) variable delay circuit, and causes each of the one or more differences among the digital output values to be equal to or smaller than a predetermined value.

7. The time-interleaved AD converter according to claim 1, wherein
   the control circuit controls the delay time of the at least (N−1) variable delay circuit, and when the reference signal is input to the N AD converters, causes a difference between a digital output value output from each of (N−1) AD converter and a digital output value output from an AD converter other than the (N−1) AD converter to be equal to or smaller than a predetermined value, the (N−1) AD converter and the AD converter other than the (N−1) AD converter being included in the N AD converters.

8. The time-interleaved AD converter according to claim 1, wherein
   the at least (N−1) variable delay circuit is N variable delay circuits that adjust delay time for the N frequency-divided clock signals to be supplied to the N AD converters, and
   the control circuit controls the delay time of the N variable delay circuits, and when the reference signal is input to the N AD converters, causes a difference between a digital output value output from each of the N AD converters and a reference value to be equal to or smaller than a predetermined value.

9. The time-interleaved AD converter according to claim 1, further comprising:
   a reference variable delay circuit that adjusts delay time for the clock signal to be received by the low pass filter circuit or the input buffer circuit, wherein
   the control circuit controls the delay time of the reference variable delay circuit, and causes each of the N AD converters to perform sampling at a position at which inclination of a waveform of the reference signal is equal to or larger than a predetermined magnitude.

* * * * *